United States Patent
Jain et al.

(10) Patent No.: US 6,498,360 B1
(45) Date of Patent: Dec. 24, 2002

(54) COUPLED-WELL STRUCTURE FOR TRANSPORT CHANNEL IN FIELD EFFECT TRANSISTORS

(75) Inventors: Faquir C. Jain, Storrs, CT (US); Evan K. Heller, Lake Peekskill, NY (US)

(73) Assignee: University of Connecticut, Storrs, CT (US)

( * ) Notice: Subject to any disclaimer, the term of this patent is extended or adjusted under 35 U.S.C. 154(b) by 0 days.

(21) Appl. No.: 09/516,170

(22) Filed: Feb. 29, 2000

(51) Int. Cl.[7] ............... H01L 31/0328; H01L 31/0336

(52) U.S. Cl. ............... 257/194; 257/192; 257/195; 438/167; 438/172; 438/285

(58) Field of Search ................ 257/192, 194, 257/195, 17, 19, 20, 22, 24, 27; 438/285, 590, 167, 172

(56) References Cited

U.S. PATENT DOCUMENTS 4,974,038 A * 11/1990 Delagebeaudeuf et al. ... 357/22
5,023,674 A * 6/1991 Hikosaka et al. ............. 357/16

* cited by examiner

Primary Examiner—Steven Loke
Assistant Examiner—Donghee Kang
(74) Attorney, Agent, or Firm—H. C. Lin

(57) ABSTRACT

Two or more coupled sub-wells are inserted in the quantum well region of a MODFET to move the electron/hole gas away from the interface between the spacer layer and the well region. The channel can be constructed with a wire cross-section to confine the electron/hole gas in two dimensions, thereby reducing the scattering and improving the device performance. Structures with supply layer contacts, along with their application are described. Laterally coupled quantum wire MODFETs are also disclosed. The insertion of a coupled-well transport channel is applicable for Si MOSFETs in improving the high frequency performance.

27 Claims, 11 Drawing Sheets

(a) Finite Square Wire - no coupling (b) Coupled Finite Square Wires (c) Coupled Parabolic Wires

COUPLED-WELL STRUCTURE FOR TRANSPORT CHANNEL IN FIELD EFFECT TRANSISTORS

BACKGROUND OF THE INVENTION (1) Field of the Invention

This invention relates to semiconductor field-effect transistors, in particular to modulation doped field effect transistors (MODFETs)

(2) Description of the Related Art

In semiconductor device technology, it is desirable to have transistors with high frequency capability. The performance of a conventional metal-oxide-semiconductor (MOS) field-effect transistor (FET) is limited by scattering mechanisms. Scattering is due to the collision of charge carriers (electrons or holes) with impurities, lattice defects, and interface roughness at the $SiO_2$/Si boundary. Dopant impurities are necessary to control the semiconductor conductivity. The technique of modulation doping has been devised to spatially separate the impurities from the charge transport channel. Modulation doped FET (MODFET) structures are known to overcome the scattering problem of a conventional FET.

In a basic semiconductor MODFET structure as shown in FIG. 1, a lightly doped p$^-$InGaAs layer 11 is grown over an InP substrate 10 and is covered by an undoped [or not intentionally doped (NID)] InAlAs spacer layer 12 and an n-type InAlAs supply layer 13. Source contact 14 and drain contact 15 are formed respectively at the two ends of the supply layer 13 in the longitudinal (z) direction on an n$^+$ region 16. A gate 17 of length L and width W covers the channel between the source 14 and drain 15 to control the current flow between them (without making an electrical contact). The gate is typically a Schottky contact on top of a cap layer 18. The n-InGaAs cap layer is grown over the supply layer.

The principle of operation is to establish an electron gas 19 at the heterointerface between the InGaAs layer 11 and the InAlAs spacer 12. The gas 19 forms on the InGaAs layer 11 side of this interface in a triangular conduction band quantum well. Since in this p$^-$ or undoped (NID) layer 11, there are no impurities to scatter the electrons, the electrons can move with reduced collision frequency under an applied electric field between the source 14 and drain 15. As a result of this type of carrier channel, the MODFET has a much better high frequency performance than the order of 150 angstroms or less, then the electron gas 19 is confined in the lateral (x) direction, resulting in a quantum wire MODFET.

The MODFET, however, has a trade-off between impurity scattering and charge control. The spacer layer 12 is included in a typical device to provide a buffer between the electron gas 19 channel and the InAlAs supply layer 13. A thicker spacer reduces the impurity scattering, but at the expense of gate control, which results in a lower device transconductance, and poorer high-frequency performance. Thus, improvements to the basic MODFET structure are desirable.

SUMMARY OF THE INVENTION

An object of the present invention is to improve the high frequency performance of FETs and MODFETs. This objective is achieved by inserting a coupled-well transport channel in place of a conventional channel. In the case of MODFETs, this can be achieved by inserting an InGaAs/InAlAs/InGaAs coupled-well layer 11 in MODFETs. The coupled-well is created by two thin layers (wells) of InGaAs with a thin InAlAs barrier separating them. The coupled-well provides a potential profile in the transverse y-direction to move the electron gas 19 away from the interface (between the spacer 12 and the p$^-$InGaAs layer 12), while maintaining the same gate control. For Si/Ge MODFETS, the coupled-well structure may be incorporated in devices for the Schottky type as well as MOS type gates. MOS gate MODFETs permit self-aligned gate structure as in MOSFETs.

For Si MOSFETs, one can have a SiGe/Si/SiGe coupled well adjacent to $SiO_2$—Si (thin) layer. Here, Si layer adjacent to $SiO_2$ gate oxide is thin, and transfers inversion layer charge to one of the SiGe quantum wells in the asymmetric coupled-well configuration. It may be mentioned that metal gate is generally replaced by a poly Si gate.

Another object of this invention is to reduce the width, W, of the channel in the lateral x-direction, so as to realize quantum wire MODFETs, for the purpose of achieving low-power operation, while enhancing the high-frequency performance. A variation of this is to obtain quantum dot MODFETs by reducing the channel length L in the z-direction.

Still another object of this invention is to provide a multiple channel quantum wire MODFET capable of coherent switching and other functions that are not achievable in conventional MODFETs. Still another objective of this invention is to realize a MODFET in which the supply layer is contacted independently, resulting in multiple gates. This enables dynamic selection of operational mode between normally ON (enhancement mode) and normally OFF (depletion mode), resulting in complementary logic. Supply layer contacts also allow precise control of depletion in the supply layer. These types of MODFET structures have an application in heterostructure acoustic charge transport spatial light modulators (HACT-SLMs). Unlike in conventional HACTs/HACT-SLMs, where the depletion is set by the cap layer during processing, and can degrade over time, the current invention allows continual depletion control through biasing.

The multiple channel quantum wire MODFET objective is achieved by laying side by side two laterally (x direction) coupled channels each with individual source, drain, and gate contacts.

DETAILED DESCRIPTION OF THE INVENTION

Figure 1:
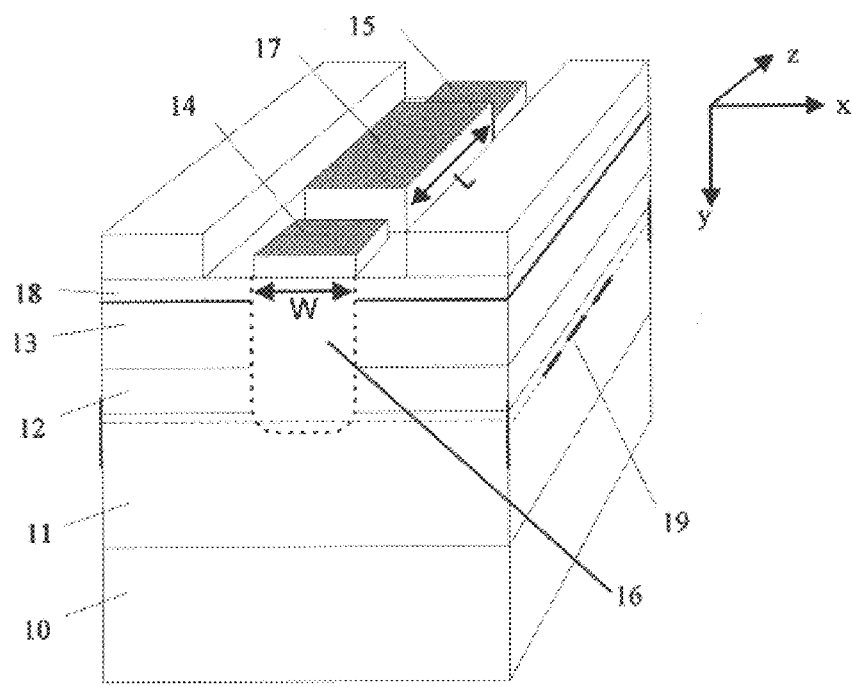
FIG. 1 shows the cross section of a basic MODFET structure.
Figure 2A:
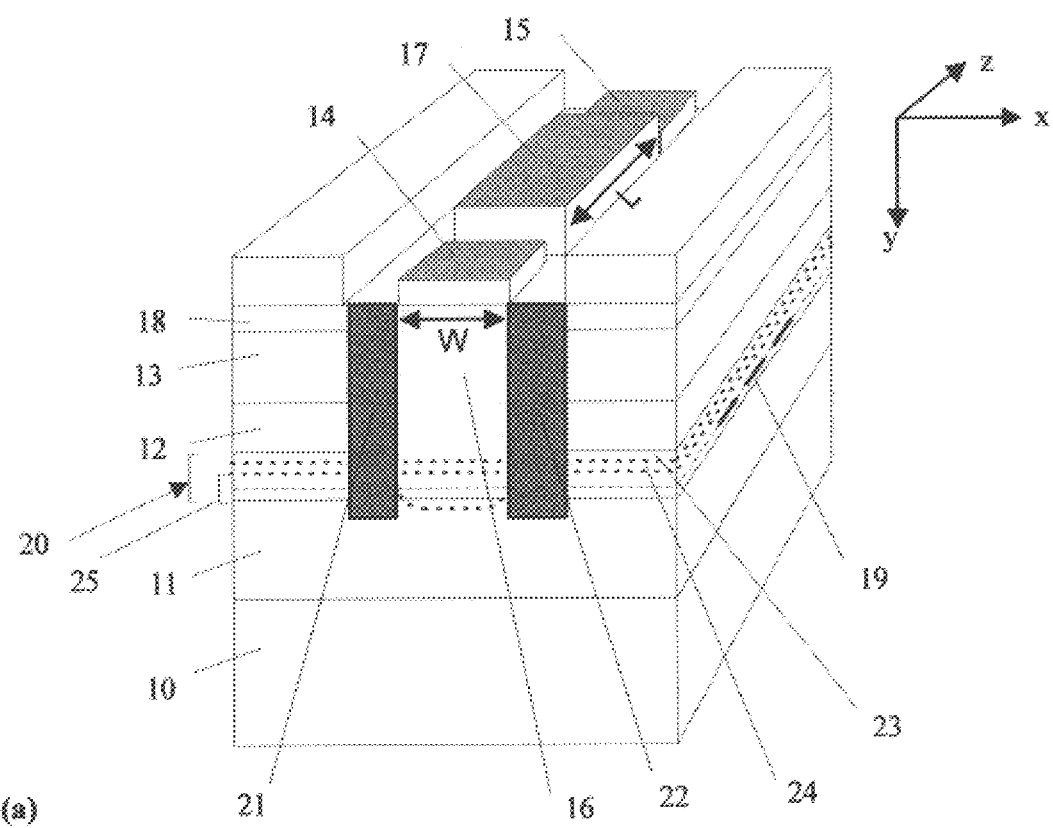
FIG. 2(a) shows the structure of the present invention.
Figure 2B:
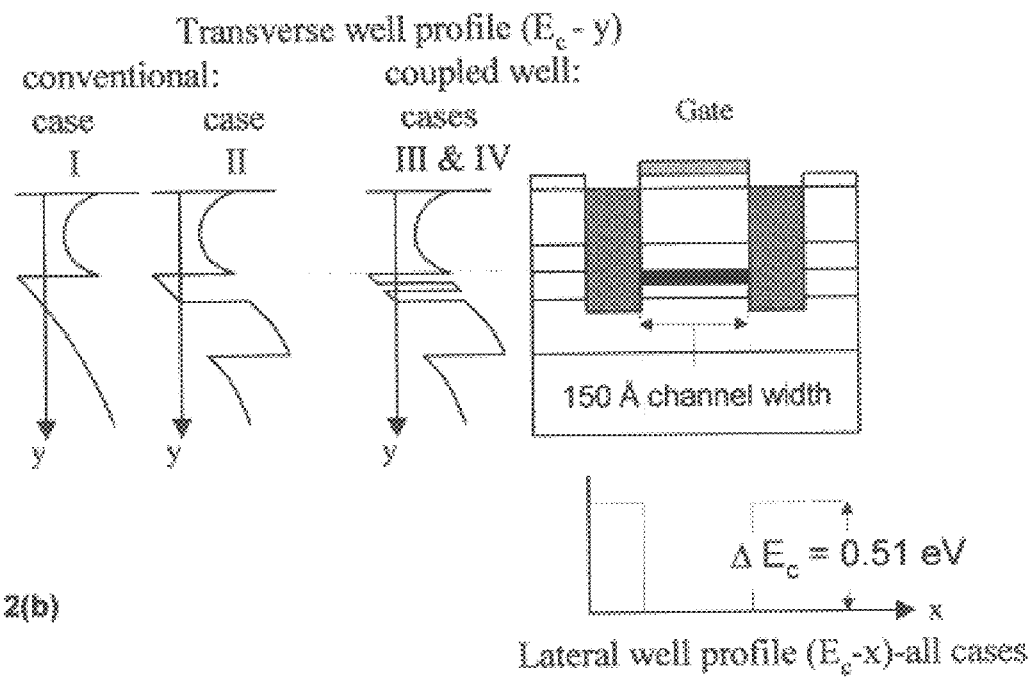
FIG. 2(b) shows the lateral (x-direction) cross section of the present invention and the transverse well profile of FIG. 2(a)
Figure 2C:
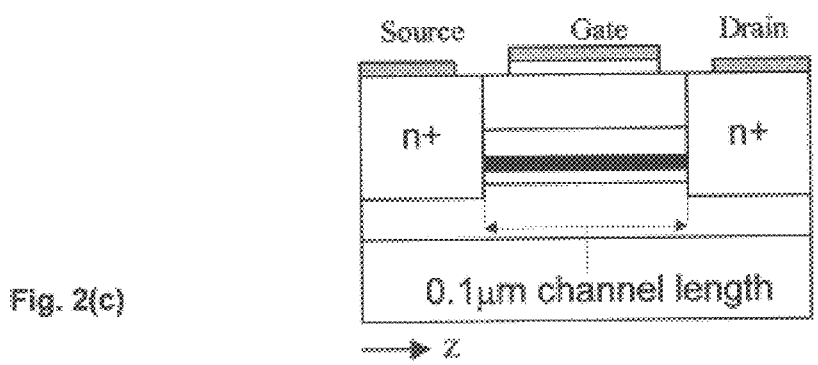
FIG. 2(c) shows the longitudinal cross section (z-direction) of FIG. 2(a).
Figure 3:
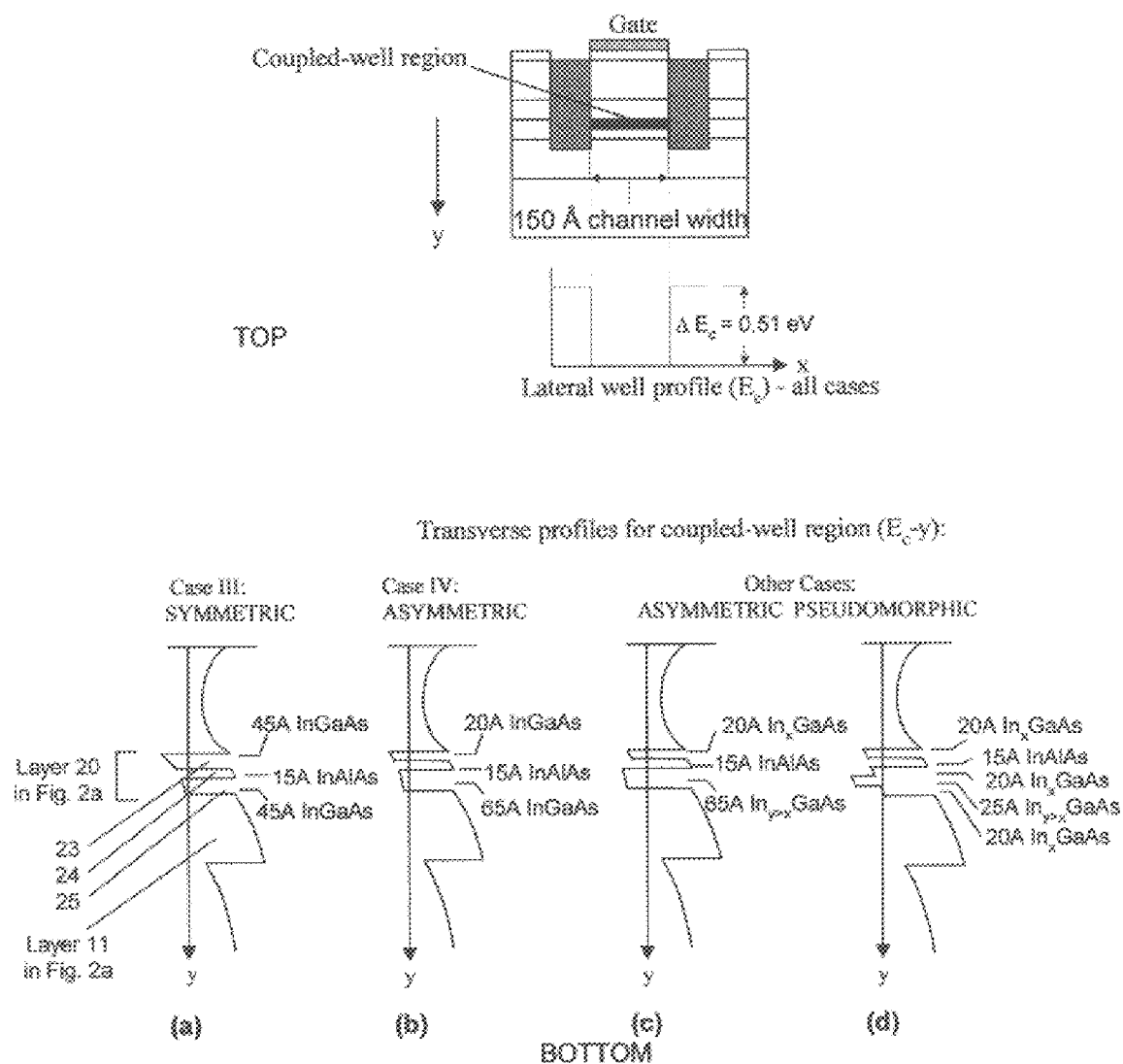
FIG. 3 shows transverse profiles of the coupled-well region in the NID layer for (a) symmetric channel, (b) asymmetric channel, (c) and (d) for pseudomorphic asymmetric coupled well channels.

FIG. 2 shows the MODFET structure of the present invention. A p-InAlAs layer 11 is grown over an InP substrate 10 (optional buffer layer between 10 and 12 is not shown) and is stacked successively with ~100 Å NID InGaAs/InAlAs coupled-well layer 20 [the details are shown in FIG. 2b as Cases III and IV, and FIG. 3; see layer 23{InGaAs}, layer 24{InAlAs}, and layer 25 {InGaAs}], a ~30 Å undoped InAlAs spacer layer 12, an n-doped (or δ-doped) InAlAs supply layer 13 (thickness depending on doping concentration 200–500 Å), and a thin (~40–100 Å) n-InGaAs cap layer 18. The NID well layer 20 forms the channel (consisting of electron gas shown as layer 19) of the MODFET in the longitudinal z-direction. Two n$^+$ regions (source side shown as 16) are diffused/ion implanted to contact the channel, forming source and drain (source and drain contacts are shown as 14 and 15, respectively), and a gate 17 is placed over the channel between the source and drain n$^+$ diffusions. The two regions 21, 22 are two barriers/walls (physical as well as potential) to confine the width W to form a wire channel and to confine the current flow within the channel along the x direction.

The performance of modulation doped field-effect transistors (MODFETs) is subject mainly to the magnitude and distribution of the confined carrier concentration, $n_s$, in the quantum well or wire channel. This in turn is dependent on the thickness and doping of the supply layer 13 and the thickness of the spacer layer 12. Larger spacer layers will reduce the impurity scattering in the channel, but also tend to decrease $n_s$. This invention involves employing coupled-well channels for quantum well in the transverse direction (y), wire and dot MODFETs as shown in FIG. 3(a), (b), (c) and (d). These figures show that by inserting a 15 Å InAlAs barrier, adjacent to the heterointerface, carrier concentration profile can be located to lie farther away from the interface without affecting the gate control, resulting in superior high-frequency performance.

The novelty lies in controlling the placement of the barrier with respect to the interface. This in turn modifies the electron wavefunctions and their distribution in the well. Shifting the peak of the carrier distribution further away from the interface reduces impurity scattering for a given spacer thickness, and significantly increasing the mobility in the channel. The asymmetric coupled well MODFETs particularly yield superior current-voltage and frequency behaviors for quantum well/wire channel configurations. The coupled wells could be pseudomorphic in entirety or in part. That is one of the two wells could be pseudomorphic (with strained lattice). For example, the wider well region of the coupled well could be pseudomorphic.

FIG. 2(b) describes a quantum wire MODFET structure with various transverse potential profiles in the transport channel. Four cases of transverse potential profiles are presented. Case I and Case II represent the prior-art configurations, and Cases III and IV describe the structures of the present invention. For simplicity of explanation, all cases are shown with a finite square well potential along the lateral x-direction. The variations are along the transverse y-direction and include:

Case-I) a conventional triangular potential well profile,

Case-II) a 100 Å heterostructure single quantum well, as shown by not intentionally doped (NID) InGaAs 100 Å layer, in FIG. 2(b), Case-III) a coupled-well consisting of 45 Å and 40 Å regions separated by a 15 Å barrier, and Case IV) an asymmetric coupled-well consisting of 20 Å and 65 Å regions separated by a 15 Å barrier.

The InAlAs/InGaAs/InP material system is selected as an example as it offers higher mobility and saturation velocity than AlGaAs/GaAs system, making it promising for high frequency operation. It also provides larger conduction band discontinuities (~0.51 eV vs ~0.32 eV for AlGaAs/GaAs) which leads to higher confined carrier densities. Specifically, $In_{0.52}Al_{0.48}As/In_{0.53}Ga_{0.47}As/InP$ has been chosen, as this system is lattice. The supply layer is δ-doped, again to increase carrier densities, and also to reduce parasitic MESFET effects.

FIGS. 3(a), (b), (c) and (d) further highlight the coupled-well profiles in detail. For example, symmetric coupled well channel (Case III, FIG. 3a) is compared with an asymmetric channel (Case IV, FIG. 3b). In addition, two examples of Asymmetric Pseudomorphic channels are presented in FIGS. 3c and 3d, respectively. Pseudomorphic layers of InGaAs are grown by changing the composition away from the lattice matching. Lowering the InGaAs energy gap by increasing the Indium content assists in further determining the location of the electron peak.

Figure 4:
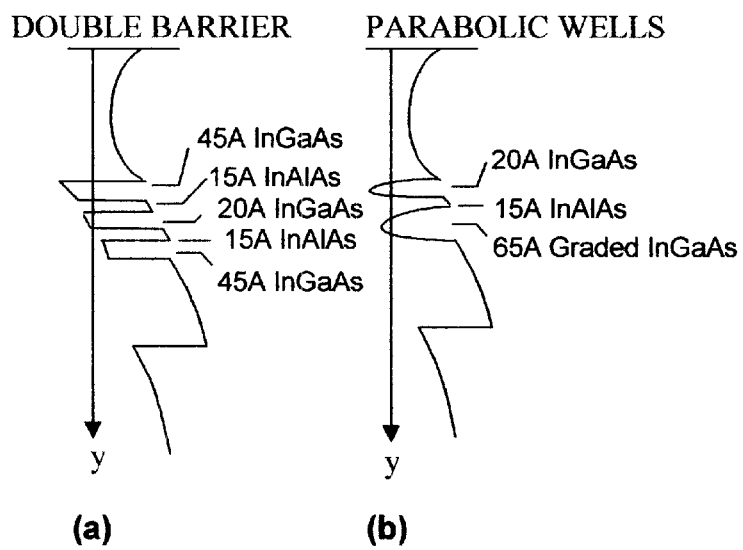
FIG. 4(b) shows the transverse profiles for a multiple barrier coupled-well channel, and (b) for parabolic coupled well channel.

Use of multiple barriers in the quantum well, that retains the coupled-well feature, is presented in FIG. 4a. The use of a non-square (e.g. parabolic well) is shown in FIG. 4b. Parabolic wells have different spacing of the energy states.

The improvements offered by the asymmetric coupled-well channel are due to: (1) the shift in the location of one-dimensional electron or hole gas with respect to the spacer/channel interface [which is accomplished by the insertion of a barrier (or barrier layers)] in the transverse quantum well, (2) shaping the charge distribution, and (3) higher carrier mobility due to reduced scattering obtained by moving the charge carriers away from the ionized impurities in the supply layer. The concept is shown by simulating AlGaAs—GaAs and InAlAs/InGaAs MODFETs. Effect of spacer layer thickness is also considered. The approach is generic to other systems including InGaN—GaN, AlGaN—GaN, and Si—Ge.

Figure 5:
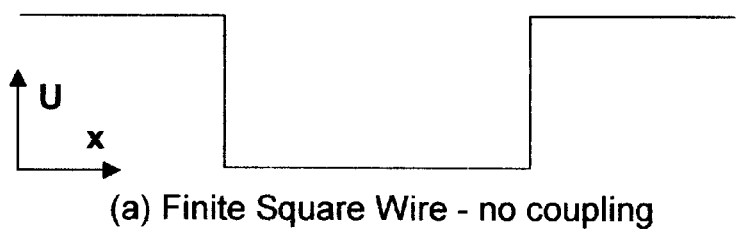
FIG. 5(a) shows the potential profile of a finite square wire channel.
FIG. 5(b) shows the potential profile of a coupled finite square wire channel.
FIG. 5(c) shows the potential profile of a coupled parabolic wire channel.
Figure 5:
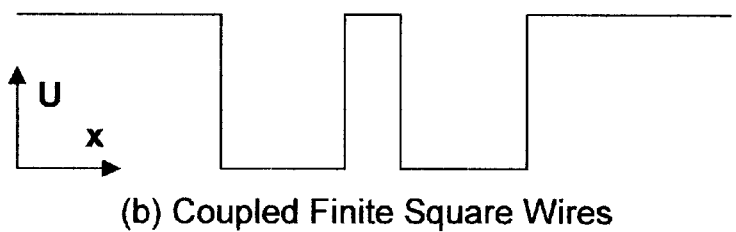
Figure 5:
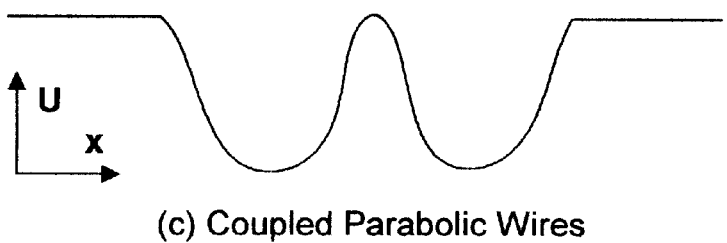

Another embodiment of the present invention is to couple the quantum wires along the lateral x-direction of the channel. Current capability of a quantum wire MODFET can be enhanced using laterally-coupled (along x-axis) wires as shown in FIGS. 5(b) and 5(c) as compared with a finite square wire shown in FIG. 5(a). That is, in addition to coupling across the transverse direction, the channels are coupled along the lateral axis. FIGS. 5 (a), (b) and (c) also depict various potential profiles. These wells can be symmetrical or asymmetrical.

Figure 6A:
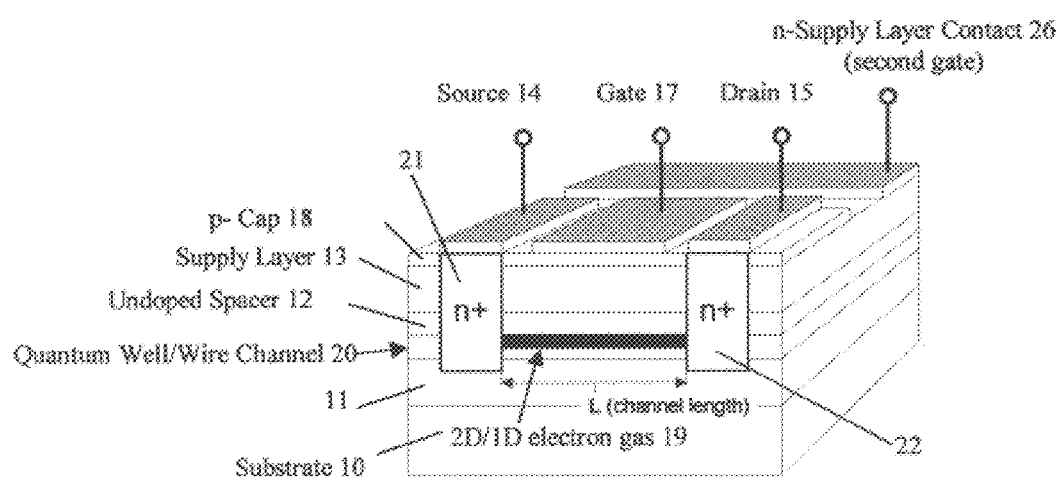
FIG. 6 shows an n-channel MODFET having a gate contact on a p-cap layer and a second gate contact on the n-supply layer.
FIG. 6b shows the MODFET channel integrated in the multiple quantum well (MQWs) spatial light modulator (SLM) configuration where charge is transported in the MODFET channel via surface acoustic waves (heterostructure acoustic charge transport, HACT), modulating the 1.55 micron incident light (corresponding to exciton formation in InGaAsP/InP MQWs). The modulation depends on the magnitude of charge transport, which in turn is determined by the injecting electrode.

This new category of MODFET, shown in FIG. 6a, has another feature in that is a supply layer has an ohmic contact. Unlike conventional MODFETs, it includes a separate contact 26 to the supply layer 13 with its own bias with respect to the p-InGaAs cap layer 18. The n-channel MODFET comprises a p-InGaAs cap layer 18, n InAlAs supply layer 13, NID spacer layer 12, and p⁻ quantum well/coupled-well transport layer 20 hosting the electron gas 19. The p-cap layer 20 may have an ohmic contact or a Schottky contact 26. The p-cap 18 and the n-supply layer 13 forms a reverse biased junction. The bias at gate 17, supply layer contact 26, along with source 14 and drain 15 biases collectively control the charge density in the quantum transport channel. They also govern the extent of depletion of the supply layer. The source and drain are constructed in a similar way as in conventional MODFETs. The usage of p-cap permits the formation of a self-aligned structure. The supply layer contact can be treated as the second gate.

Depending on the bias of gate and supply layer, we can have normally ON (enhancement mode) or normally OFF (depletion mode) devices. Integration of a p-channel MODFET would yield complementary field-effect transistors, providing added CMODFET based circuits.

Figure 6B:
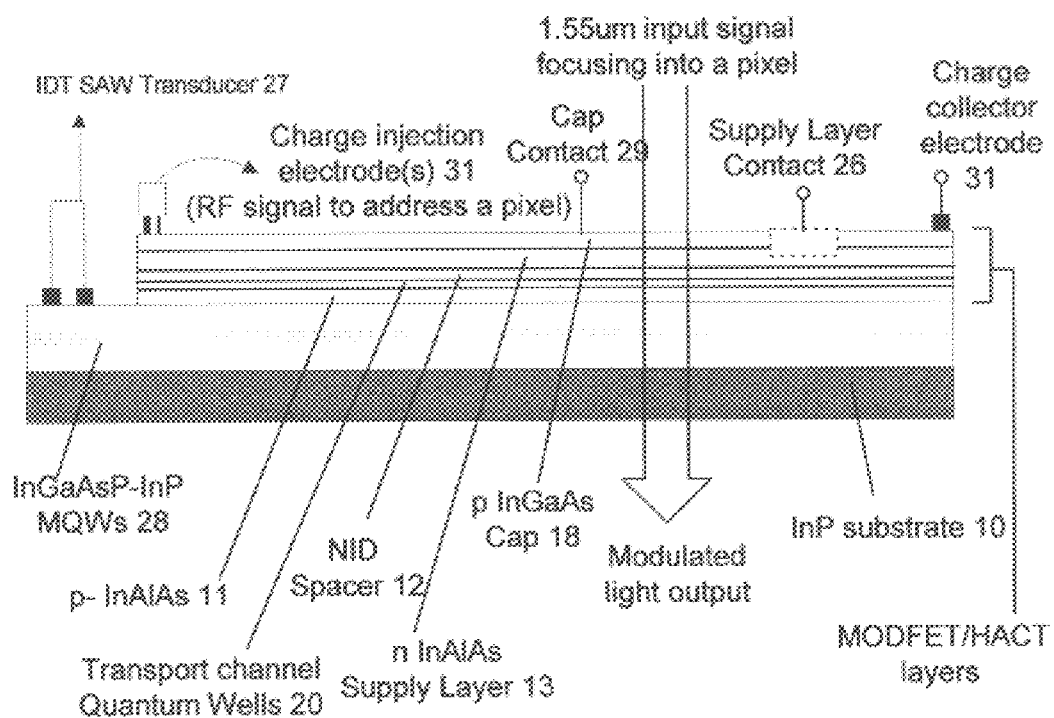

FIG. 6b shows the MODFET channel integrated with multiple quantum wells (MQWs) to form a spatial light modulator (SLM) configuration. Here, the electron charge, proportional to the input signal, is transported in the MODFET channel via surface acoustic waves, SAW, launched by an interdigitated transducer (IDT) 27. This is known in the literature as heterostructure acoustic charge transport, HACT. The signal charge in the channel 20 modulates the light incident on MQW layers 28. For example, InGaAsP-InP MQWs are designed to operate at 1.55 micron incident light (corresponding to exciton formation in InGaAsP/InP MQWs). The modulation is achieved by changing the electric field across the MQW layers, which in turn changes excitonic absorption and/or index of refraction. Depending on the magnitude of signal charge transported in the channel, modulation of the incident beam takes place.

Unlike in conventional electronic HACTs or HACT-SLMs, where the depletion is set by adjusting the thickness of the cap layer during processing (and which degrade over time), the current invention allows continual depletion control through biasing of cap contact 29 and supply layer contact 26. Heterostructure acoustic charge transport SLMs are reported in the literature. The signal charge is injected by a set of ground and charge injection electrodes 30. It is transported in the channel by the SAW and is collected by the electrode 31. The novelty of the invention lies in the contact to the supply and cap layers which permit depletion of supply layer and is relatively free of degradation due to changes in cap layer in conventional HACT devices. The HACT part can be used for electronic signal processing.

Figure 7:
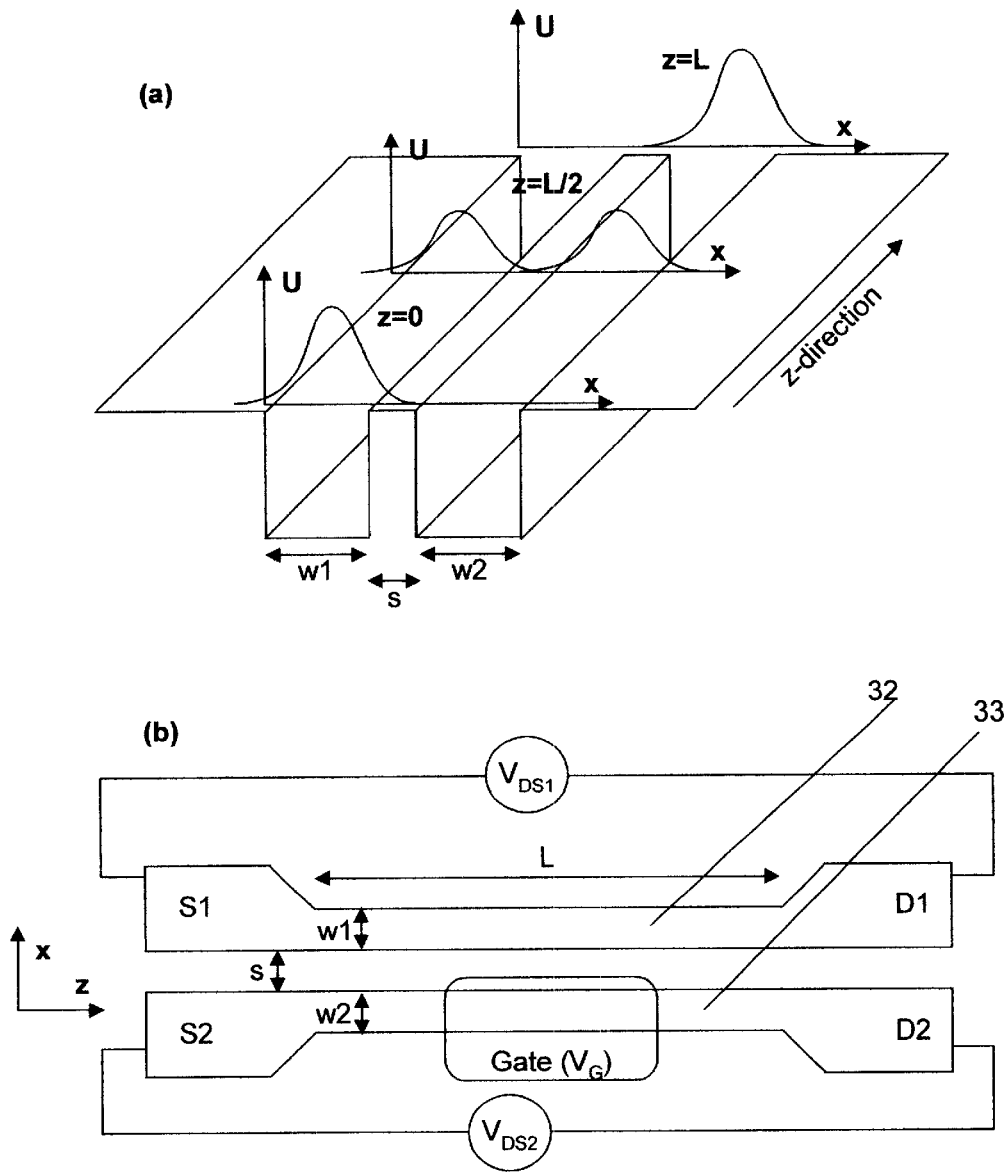
FIG. 7(a) shows the top view of a quantum wire MODFET.
FIG. 7(b) shows a lateral potential profile of FIG. 7(a).

FIG. 7(a) describe two directionally coupled quantum wire channels 32, 33. Here, the switching of ballistic electrons (from left wire to right wire) in a coupled wire structure. The contact topology for implementing the structure is shown in FIG. 7(b). The device is like directional couplers in photonics. Electron wavepackets can be switched from one path to the other by applying an appropriate voltage across the gate of one channel. The condition of phase coherence (e.g. ballistic electrons) is crucial and will determine the channel length and the operational temperature.

In the foregoing descriptions, the MODFET is based on InAlAs—InGaAs compound semiconductor material with a Schottky barrier gate. The coupled-well structure is applicable to other MODFET devices such as Si—SiGe MODFETs, (similar to InAlAs=Si and InGaAs=SiGe), MOS-gate MODFETs in Si—SiGe having a MOS gate instead of a Schottky barrier gate, and MOSFET devices.

Figure 8:
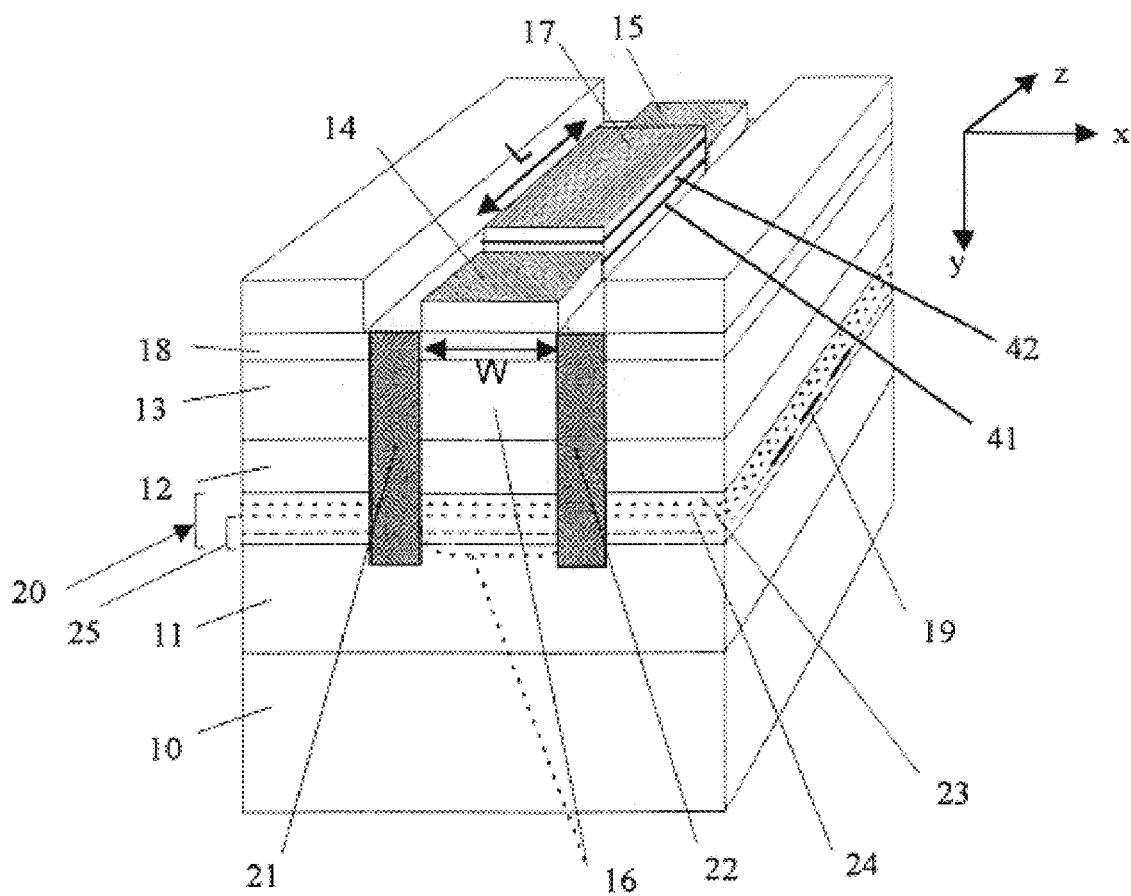
FIG. 8 shows the MOS-gate MODFET having a poly Si gate, resulting in self-aligned source and drain regions.

FIG. 8 shows an n-channel MOS-gate MODFET in Si—SiGe material system. A metal-oxide-semiconductor (MOS) gate modulation-doped field-effect transistor (MODFET), comprising multiple layers of a Si substrate or Si-on-insulator substrate 10; a first p-doped Si layer grown over said substrate 11; a not-intentionally-doped (ND) well 20 grown over said first p-doped layer, said well having at least two SiGe coupled sub-wells 23 and 25 separated via a thin Si barrier layer 24; an undoped/NID spacer Si layer 12 grown over said NID well; an electron supply n–SiGe or Si layer 13 grown over said spacer layer; an undoped or n⁻Si cap layer 18 grown over said electron supply layer; a $SiO_2$ gate oxide layer 41 grown over said cap layer 18; a poly-Si gate layer 42 grown on said $SiO_2$ layer 41; a n⁺ source diffusion/implantation 16 through openings in the gate oxide layers to said first p-doped layer 11 to form the source of said MOS-gate MODFET; a n⁺ drain diffusion/implantation through openings in the gate oxide layers to said first p-doped layer to form the drain of said MODFET; the said source and drain diffusions having contacts 14 and 15 respectively, the said poly Si gate layer 42 having a contact 17; the width of the gate channel is controlled by regions 21 and 22, respectively; said regions 21 and 22 are realized by several methods including etching and regrowth of an insulating region/potential barrier. The device forms an electron gas layer 19 (thick dashed line showing the gas along the channel length under the gate, and regular dashed line showing its general location) upon proper biasing of the source, drain, and gate contacts. Note that the MOS gate permits self-alignment of source and drain regions, and therefore, different from MODFET shown in FIG. 2(a).

Figure 9:
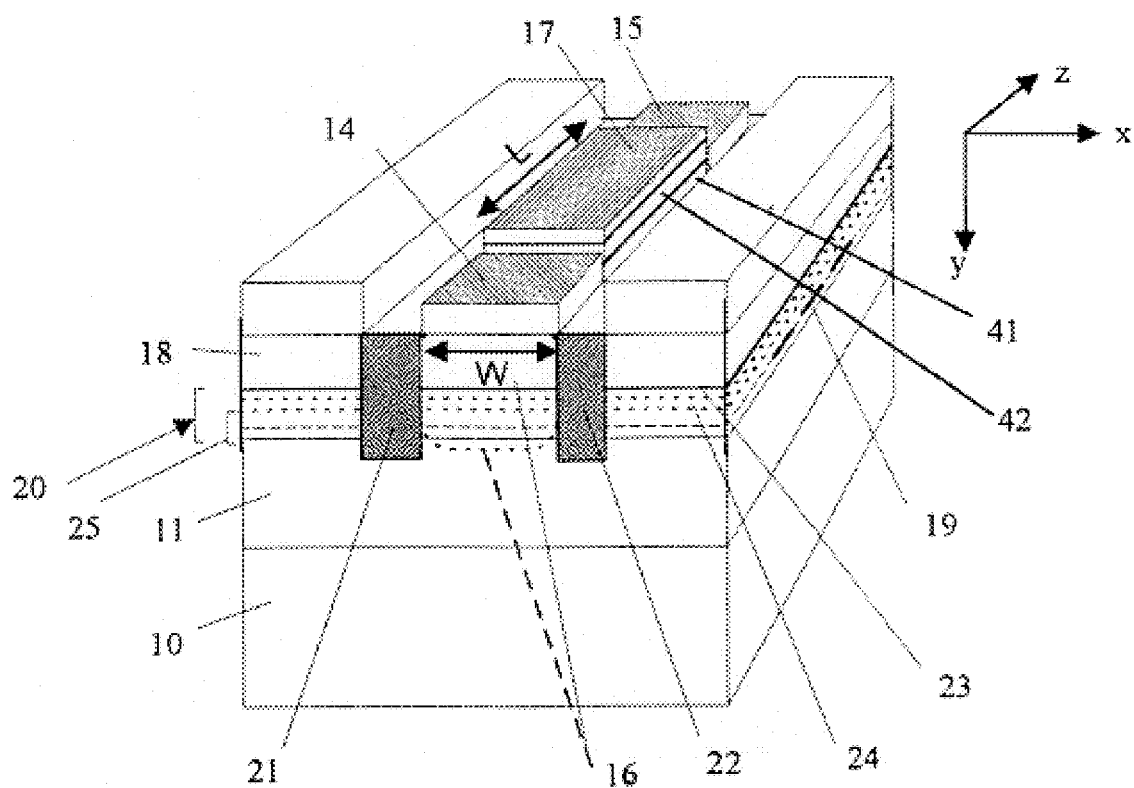
FIG. 9 shows an n-channel MOSFET employing coupled well SiGe/Si/SiGe transport channel.

FIG. 9 shows an n-channel MOSFET in Si—SiGe material system. A metal-oxide-semiconductor field-effect transistor (MOSFET), comprising multiple layers of a Si substrate or Si-on-insulator (SOI) substrate 10; a first p-doped Si layer grown over said substrate 11; a not-intentionally-doped (NID) well 20 grown over said first p-doped layer, said well having at least two SiGe coupled sub-wells 23 and 25 separated via a thin Si barrier layer 24; an undoped or p⁻ Si cap layer 18 adjacent to subwell 23; a $SiO_2$ gate oxide layer 41 grown over said cap layer 18; a poly-Si gate layer 42 grown on said $SiO_2$ layer 41; an n⁺ source diffusion/implantation 16 through openings in the gate oxide layers to said first p-doped layer 11 to form the source of said MOSFET; an n⁺ drain diffusion/implantation through openings in the gate oxide layers to said first p-doped layer to form the drain of said MOSFET; the said source and drain diffusions having contacts 14 and 15 respectively, the said poly Si gate layer 42 having a contact 17. The channel width W is defined by insulating regions 21 and 22, respectively. They can be implemented via The device forms an electron gas layer 19 (the bold dash show the location along the channel length while the regular dashed line shows its location relative to the quantum wells) upon proper biasing of the source, drain, and gate contacts. The MOSFET can be configured with n⁻ lightly doped drain (LDD) and source regions contiguous to said n⁺ source and drain regions. In addition, the device can incorporate p- type halo doping around the source and drain diffusions, as is well known in the prior art.

While the preferred embodiments of the invention have been described, it will be apparent to those skilled in the art that various modifications may be made in the embodiments without departing from the spirit of the present invention. Such modifications, including quantum dot channel devices, lattice matched or pseudomorphic (strained-lattice) coupled-wells, are all within the scope of this invention. We have described n-channel FET structures. P-channel FETs can be realized by switching the doping from p to n and n to p. Combination of n- and p-channels are embodiments of this invention.

What is claimed is:

1. A modulation-doped field-effect transistor (MODFET), comprising multiple layers of:
   a semi-insulating substrate;
   a first p-doped layer grown over said substrate;
   a not-intentionally-doped (NID) well grown over said first p-doped layer,
   said non-intentionally-doped (NID) well having at least two coupled sub-wells sandwiching a barrier layer;
   an undoped spacer layer grown over said NID well;
   an electron supply layer grown over said spacer layer;
   a cap layer grown over said electron supply layer;
   a source diffusion through said cap layer to said first p-doped layer to form the source of said MODFET;
   a drain diffusion through said cap layer to said first p-doped layer to form the drain of said MODFET; and
   a gate deposited over said cap layer between said drain and said source to from the gate of said MODFET.

2. The MODFET as claimed in claim 1, wherein said first p-doped layer, said barrier layer, said spacer layer, and said cap layer are selected from the group of semiconductor materials consisting of InAlAs—InGaAs, GaAs—InGaAs, InGaN—GaN, AlGaN—InGaN and Si—SiGe.

3. The MODFET as claimed in claim 1, wherein said first p-doped layer is InAlAs, said NID well is InGaAs; said undoped spacer layer is InAlAs, said supply layer is n-InAlAs, and cap layer is n-InGaAs.

4. The MODFET as claimed in claim 1, wherein the supply layer is obtained by delta-doping on an undoped layer.

5. The MODFET as claimed in claim 3, wherein said first p-doped layer is about 1 $\mu$m thick, said NID well is 100 Angstrom (Å) thick, said spacer layer is 30 Å thick, said undoped supply layer with delta doping is 205 Å thick, and said cap layer is 40 Å thick.

6. The MODFET as claimed in claim 1, wherein there are two said coupled sub-wells.

7. The MODFET as claimed in claim 6, wherein said coupled sub-wells are symmetric, and said sub-wells have strained lattice.

8. The MODFET as claimed in claim 6, wherein said sub-wells are asymmetric, and said sub-wells have strained lattice.

9. The MODFET as claimed in claim 7, wherein said sub-wells are made of InGaAs separated by InAlAs.

10. The MODFET as claimed in claim 7, wherein said InGaAs is 45 Å thick and said InAlAs is 15 Å.

11. The MODFET as claimed in claim 8, wherein said coupled sub-wells are made of InGaAs separated by InAlAs.

12. The MODFET as claimed in claim 11, wherein the sub-well closer to the n-delta-doped layer is 20 Å, the sub-well away from the n-delta-doped layer is 65 Å and the InAlAs barrier is 15 Å.

13. The MODFET as claimed in claim 1, wherein the multiple layers are segmented by at least two potential barrier regions in the transverse x-direction to form two end sections and at least one middle quantum wire channel.

14. The MODFET as claimed in claim 13, wherein said potential barrier regions are of InAlAs.

15. The MODFET as claimed in claim 13, wherein there are two said potential barrier regions.

16. The MODFET as claimed in claim 13, wherein there are three barrier regions to form two coupled parallel channels.

17. The MODFET as claimed in claim 16, wherein each of said channels can be individually turned on and off.

18. The MODFET as claimed in claim 1 with p-cap layer over the electron supply (n-type) layer, the said p-cap layer comprising an ohmic contact.

19. The MODFET as claimed in claim 18, wherein said cap layer and the supply layer form a reverse-biased junction via the cap and supply layer contacts.

20. The MODFET as claimed in claim 19, further comprising a surface acoustic wave transducer, a set of charge injecting and collecting electrodes, is formed on multiple quantum wells, and together forming a heterostructure acoustic charge transport (HACT) spatial light modulator.

21. The MODFET as claimed in claim 19, where the multiple layers are realized using InGaAs and InAlAs, the multiple quantum wells are InGaAsP—InP, and the spatial light modulator is operating at 1.55 micron.

22. The heterostructure acoustic charge transport (HACT) spatial light modulator claimed in claim 20, where the multiple layers are realized using InGaN and AlGaN, the multiple quantum wells are InGaN—GaN, and the spatial light modulator is operating at in the blue and ultraviolet regime.

23. The MODFET as claimed in claim 13, wherein the channel length in a z-direction is 200 Å or less to form a quantum dot.

24. The MODFET as claimed in claim 15, wherein the channel length in the z-direction is 200 Å or less to form a quantum dot.

25. The MODFET as claimed in claim 16, wherein the channel length in the z-direction is 200 Å or less to form a coupled quantum dot.

26. The MODFET as claimed in claim 7, wherein the coupled sub-wells are made of $Si_xGe_{1-x}$ and separated by a Si or $Si_yGe_{1-y}$ (y>x) barrier layer.

27. The MODFET as claimed in claim 8, wherein the coupled sub-wells are made of $Si_xGe_{1-x}$ and separated by a Si or $Si_yGe_{1-y}$ (y>x) barrier layer.

* * * * *